United States Patent
Kobayashi

(10) Patent No.: US 9,679,945 B2
(45) Date of Patent: Jun. 13, 2017

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventor: Yusuke Kobayashi, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/068,019

(22) Filed: Mar. 11, 2016

(65) Prior Publication Data

US 2017/0069688 A1    Mar. 9, 2017

Related U.S. Application Data

(60) Provisional application No. 62/214,662, filed on Sep. 4, 2015.

(51) Int. Cl.
| | | |
|---|---|---|
| H01L 21/00 | (2006.01) | |
| H01L 27/24 | (2006.01) | |
| H01L 45/00 | (2006.01) | |

(52) U.S. Cl.
CPC ........ H01L 27/2463 (2013.01); H01L 45/085 (2013.01); H01L 45/1233 (2013.01); H01L 45/1266 (2013.01); H01L 45/1675 (2013.01)

(58) Field of Classification Search
CPC  H01L 27/2463; H01L 45/085; H01L 45/1675
See application file for complete search history.

(56) References Cited

U.S. PATENT DOCUMENTS

| | | | | |
|---|---|---|---|---|
| 7,291,878 B2* | 11/2007 | Stipe | ........................ | G11C 7/18 257/296 |
| 8,097,903 B2* | 1/2012 | Inaba | ................. | G11C 13/0007 257/211 |
| 8,274,068 B2* | 9/2012 | Nagashima | ......... | H01L 27/0207 257/2 |
| 8,471,297 B2* | 6/2013 | Murata | ............... | H01L 27/2409 257/211 |
| 9,553,132 B1* | 1/2017 | Kobayashi | .......... | H01L 27/2481 |
| 2009/0137112 A1* | 5/2009 | Tabata | ................ | H01L 27/2409 438/631 |

(Continued)

*Primary Examiner* — Laura Menz
(74) *Attorney, Agent, or Firm* — Oblon, McClelland, Maier & Neustadt, L.L.P.

(57) ABSTRACT

According to one embodiment, a semiconductor memory device includes a first conductive layer, a second conductive layer separated from the first conductive layer in a first direction, a resistance change layer provided between the first and second conductive layers, a third conductive layer, a fourth conductive layer and a first intermediate layer. The third conductive layer is arranged with the first conductive layer in a second direction crossing the first direction. The fourth conductive layer is arranged with the second conductive layer in a direction crossing the first direction. The fourth conductive layer is arranged with the third conductive layer in the first direction. The fourth conductive layer is electrically connected with the third conductive layer. The first intermediate layer is provided between a portion of the third conductive layer and a portion of the fourth conductive layer.

11 Claims, 22 Drawing Sheets

(56) References Cited

U.S. PATENT DOCUMENTS

| | | | |
|---|---|---|---|
| 2009/0168481 A1* | 7/2009 | Stipe | G11C 5/02 365/51 |
| 2010/0264393 A1* | 10/2010 | Mikawa | H01L 27/101 257/2 |
| 2010/0295012 A1* | 11/2010 | Mikawa | G11C 13/0007 257/4 |
| 2010/0321979 A1* | 12/2010 | Yasutake | H01L 27/24 365/148 |
| 2011/0147691 A1* | 6/2011 | Yasutake | G11C 13/0004 257/2 |
| 2011/0227017 A1* | 9/2011 | Yasutake | G11C 13/0004 257/2 |
| 2012/0049148 A1* | 3/2012 | Fukano | H01L 27/2454 257/5 |
| 2012/0069628 A1* | 3/2012 | Ito | G11C 13/0002 365/148 |
| 2013/0250650 A1* | 9/2013 | Sasaki | G11C 5/025 365/148 |
| 2014/0098595 A1* | 4/2014 | Kawashima | H01L 27/101 365/148 |
| 2016/0079309 A1* | 3/2016 | Ota | H01L 27/2454 257/4 |

* cited by examiner

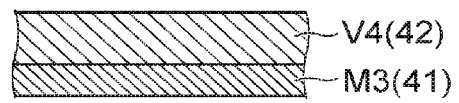
FIG. 4A  FIG. 4B
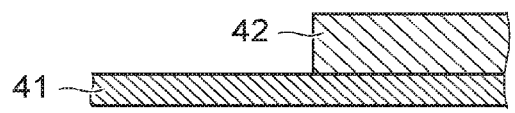
FIG. 4C  FIG. 4D
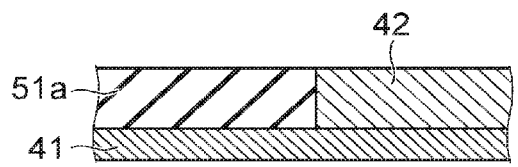
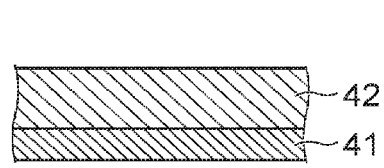
FIG. 4E  FIG. 4F
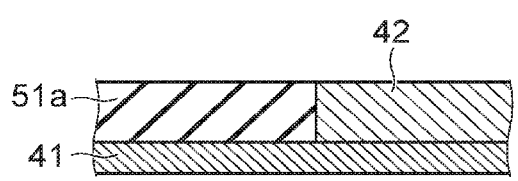
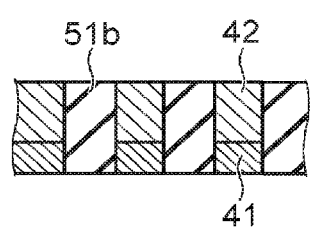
FIG. 4G  FIG. 4H

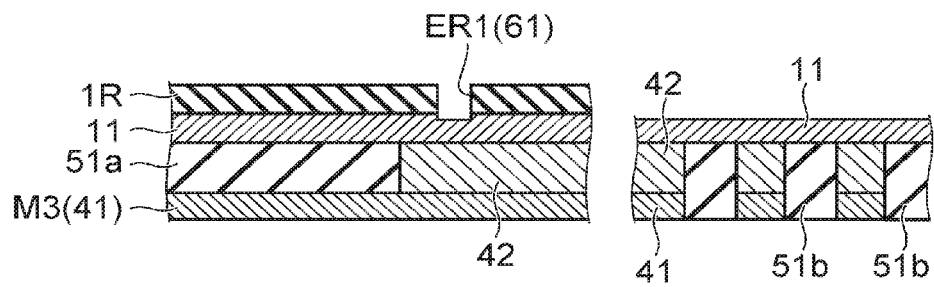
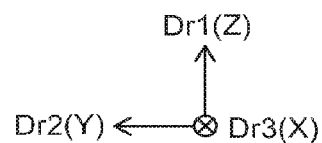 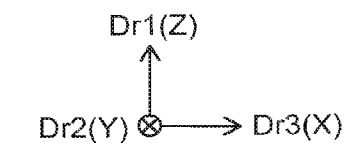
FIG. 5A    FIG. 5B
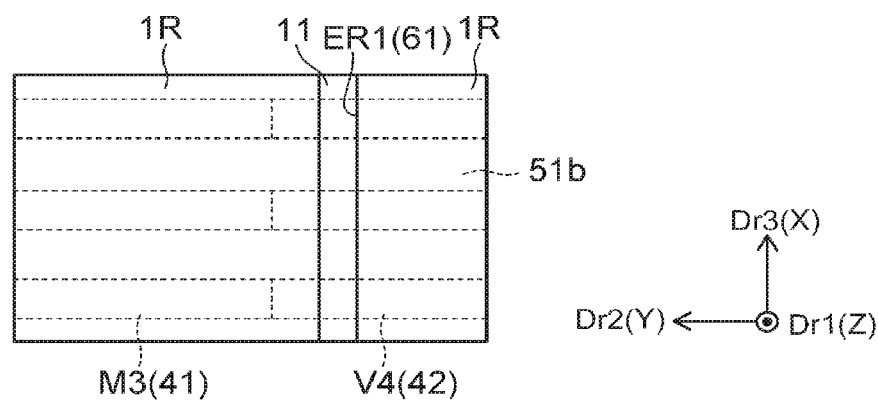
FIG. 5C

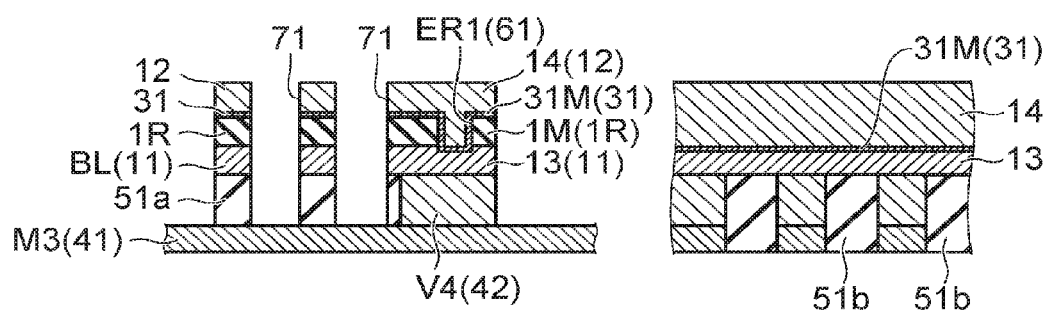
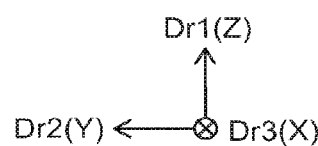
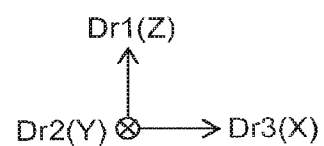
FIG. 7A          FIG. 7B
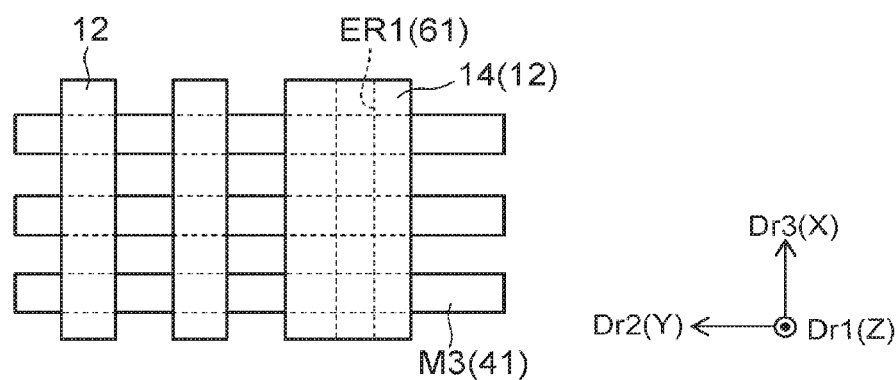
FIG. 7C

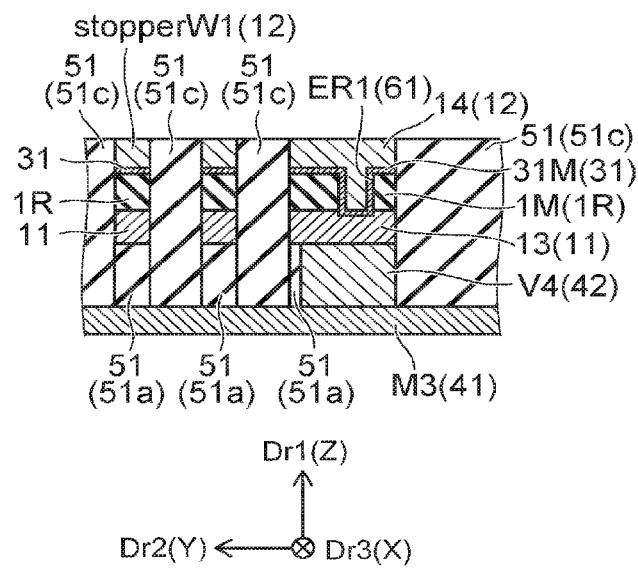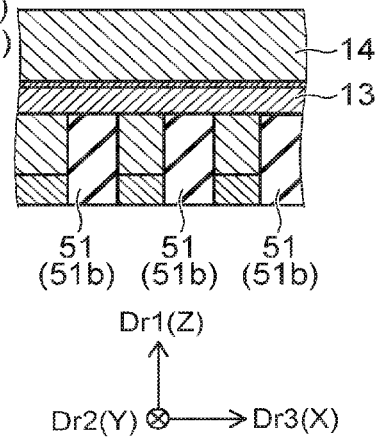
FIG. 8A    FIG. 8B
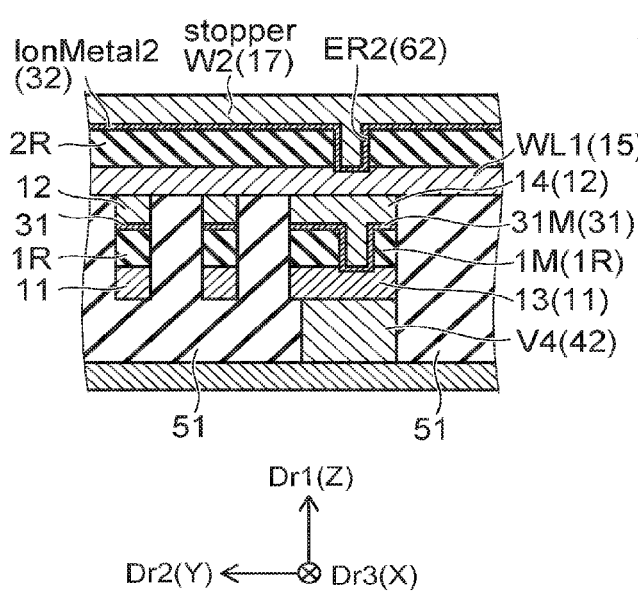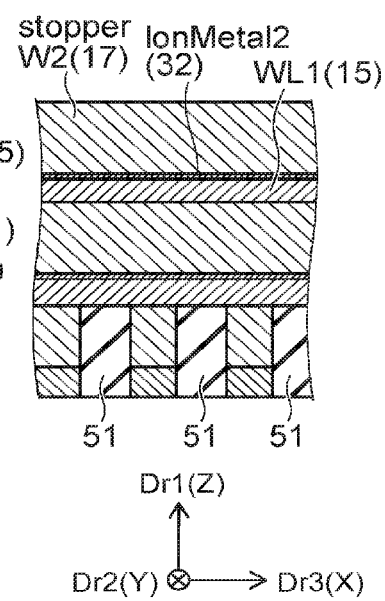
FIG. 8C    FIG. 8D

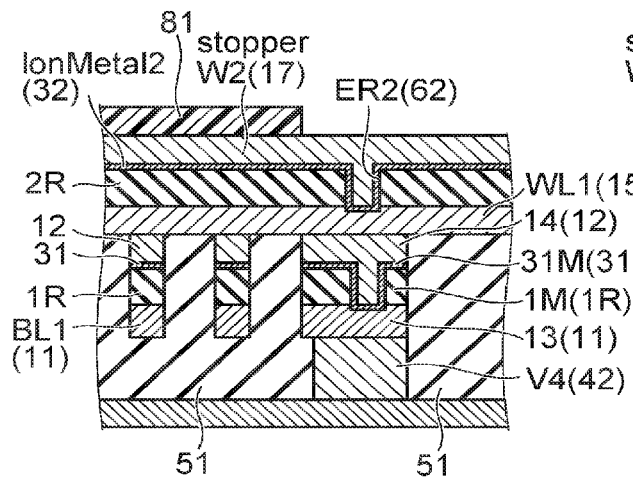
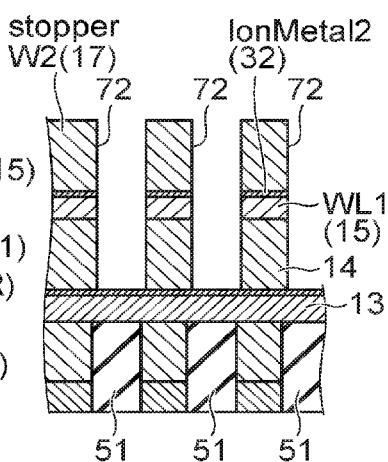
FIG. 10A    FIG. 10B
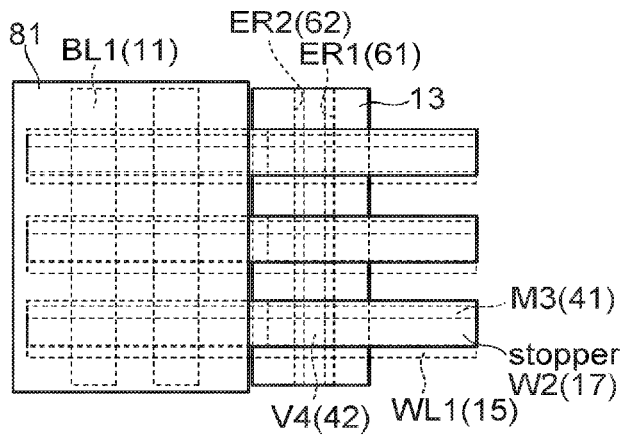
FIG. 10C

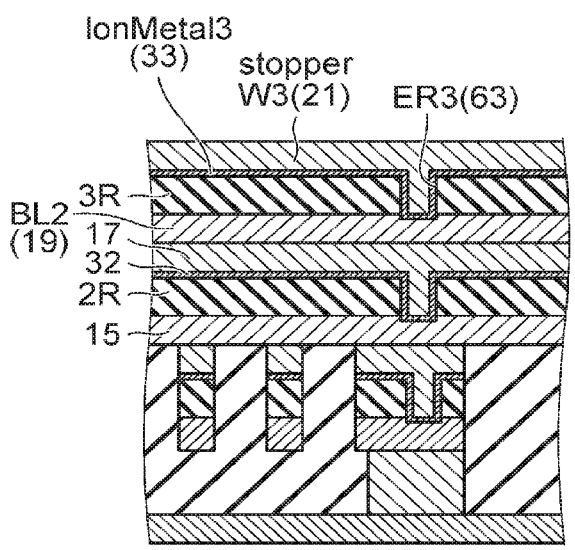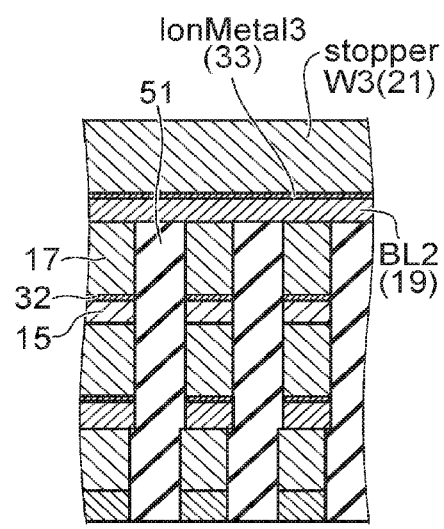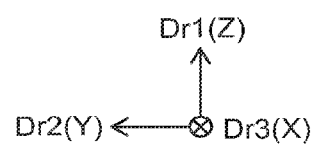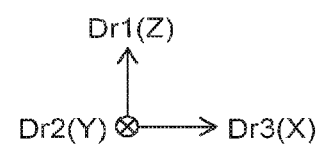
FIG. 13A    FIG. 13B

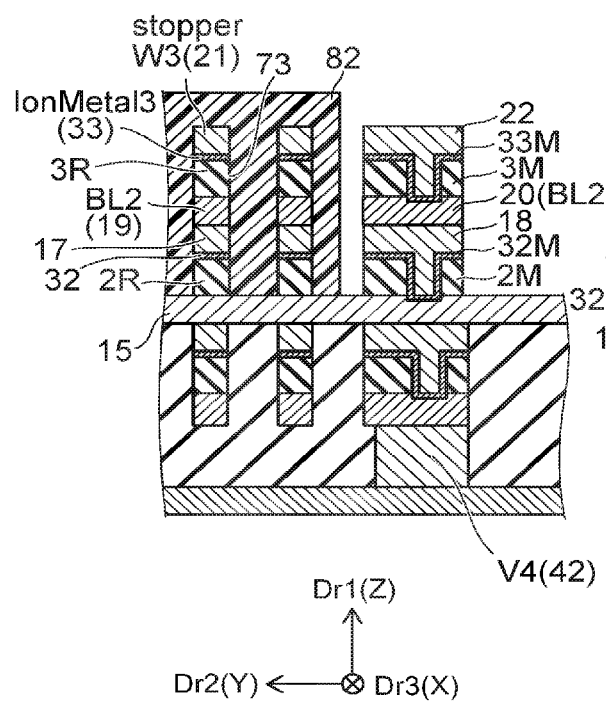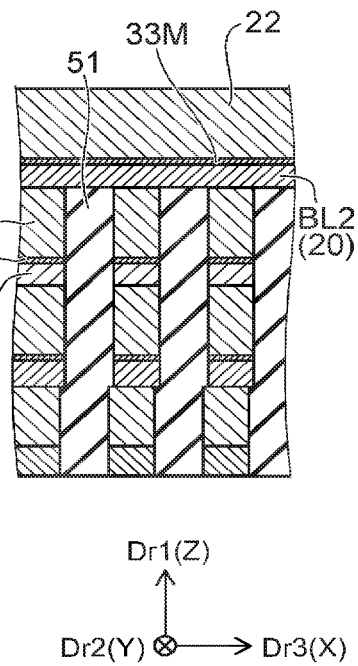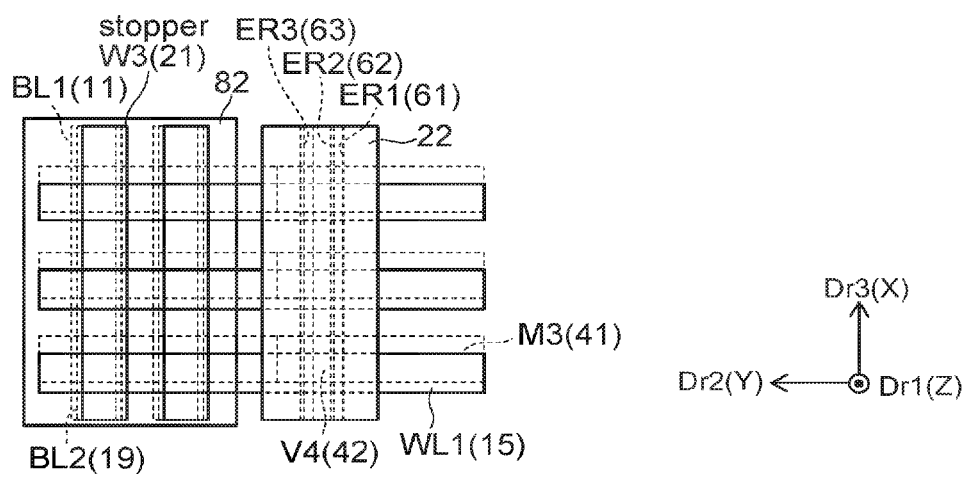
FIG. 15A
FIG. 15B
FIG. 15C

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/214,662, filed on Sep. 4, 2015; the entire contents of which are incorporated herein by reference.

FIELD

Embodiments relates to a semiconductor memory device and a method for manufacturing the same.

BACKGROUND

A cross-point type semiconductor memory device provided with a first conductive layer, a second conductive layer, and a resistance change layer therebetween has been proposed.

BRIEF DESCRIPTION OF THE DRAWINGS

FIG. 4A to FIG. 4H are schematic sectional views illustrating a method for manufacturing the semiconductor memory device according to the embodiment;

FIG. 5A, FIG. 5B, FIG. 6A, FIG. 6B, FIG. 7A, FIG. 7B, FIG. 8A to FIG. 8D, FIG. 9A, FIG. 9B, FIG. 10A, FIG. 10B, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, FIG. 20B, FIG. 21A, FIG. 21B, FIG. 22A and FIG. 22B are schematic sectional views illustrating the method for manufacturing the semiconductor memory device according to the embodiment; and FIG. 5C, FIG. 7C, FIG. 9C, FIG. 10C, FIG. 14C, FIG. 15C and FIG. 19C are schematic plan views illustrating the method for manufacturing the semiconductor memory device according to the embodiment.

DETAILED DESCRIPTION

Figure 1:
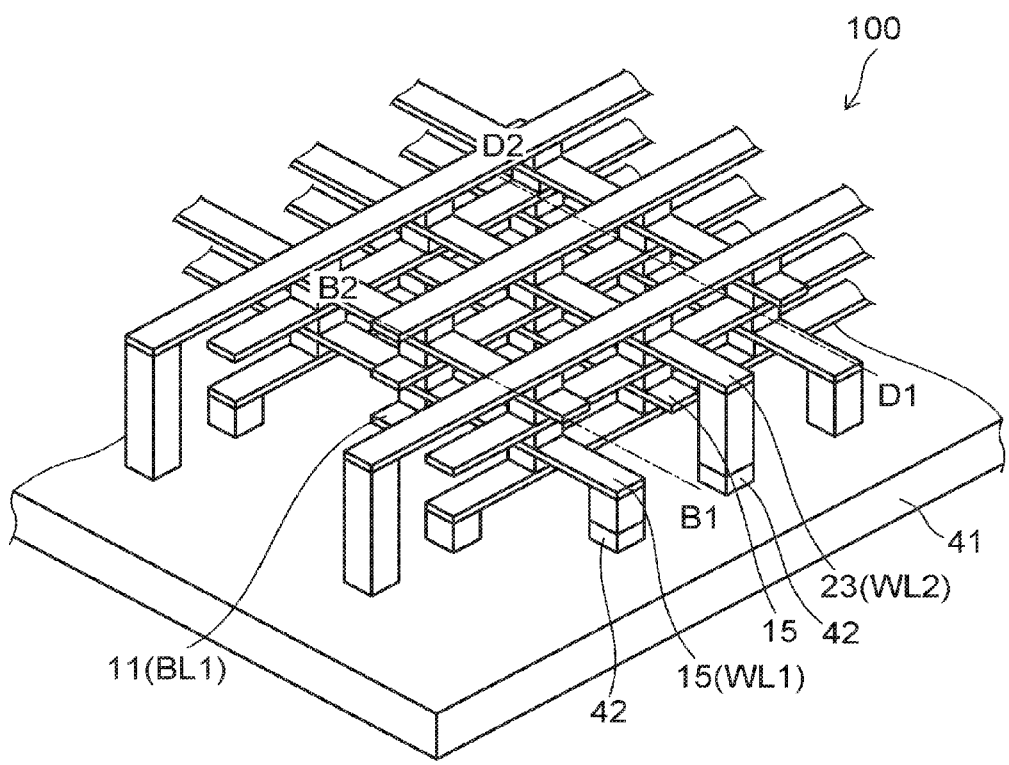
FIG. 1 is a schematic sectional view illustrating a portion of a semiconductor memory device according to an embodiment.
Figure 1:
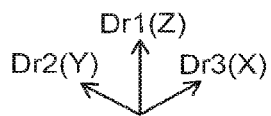

According to one embodiment, a semiconductor memory device includes a first conductive layer, a second conductive layer separated from the first conductive layer in a first direction, a first resistance change layer provided between the first conductive layer and the second conductive layer, a third conductive layer, a fourth conductive layer and a first intermediate layer. The third conductive layer is arranged with the first conductive layer in a second direction crossing the first direction. The third conductive layer contains a material contained in the first conductive layer. The fourth conductive layer is arranged with the second conductive layer in a direction crossing the first direction. The fourth conductive layer is arranged with the third conductive layer in the first direction. The fourth conductive layer is electrically connected with the third conductive layer. The fourth conductive layer contains a material contained in the second conductive layer. The first intermediate layer is provided between a portion of the third conductive layer and a portion of the fourth conductive layer. The first intermediate layer contains a material contained in the first resistance change layer.

According to one embodiment, a method for manufacturing a semiconductor memory device is disclosed. The method includes forming a conductive portion, forming a connecting portion and an insulating layer on the conductive portion, forming a first conductive layer on the connecting portion and the insulating layer, and forming a first resistance change layer on the first conductive layer. The method further includes removing a portion of the first resistance change layer and a portion of the first resistance change layer to form a groove arranged with the connecting portion in a first direction, forming a first metal-containing layer on the first conductive layer and the first resistance change layer, and depositing a conductive material on the first metal-containing layer and filling the groove with the conductive material to form a second conductive layer. The method further includes removing a portion of the second conductive layer to form a fourth conductive layer arranged with the second conductive layer in a direction crossing the first direction, and removing a portion of the first metal-containing layer to form a first metal intermediate layer between the fourth conductive layer and the first resistance change layer and between the fourth conductive layer and the third conductive layer. The method further includes removing a portion of the first resistance change layer to form a first intermediate layer arranged with the first resistance change layer in a second direction crossing the first direction and removing a portion of the first conductive layer to form a third conductive layer arranged with the first conductive layer in the second direction.

Embodiments of the invention will be described below with reference to the drawings.

Each of the embodiments of the invention will be described below with reference to the drawings.

The drawings are schematic or conceptual, and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

EMBODIMENT

An example of embodiments will be described below.

FIG. 1 is a schematic sectional view illustrating a portion of a semiconductor memory device according to an embodiment.

Figure 2A:
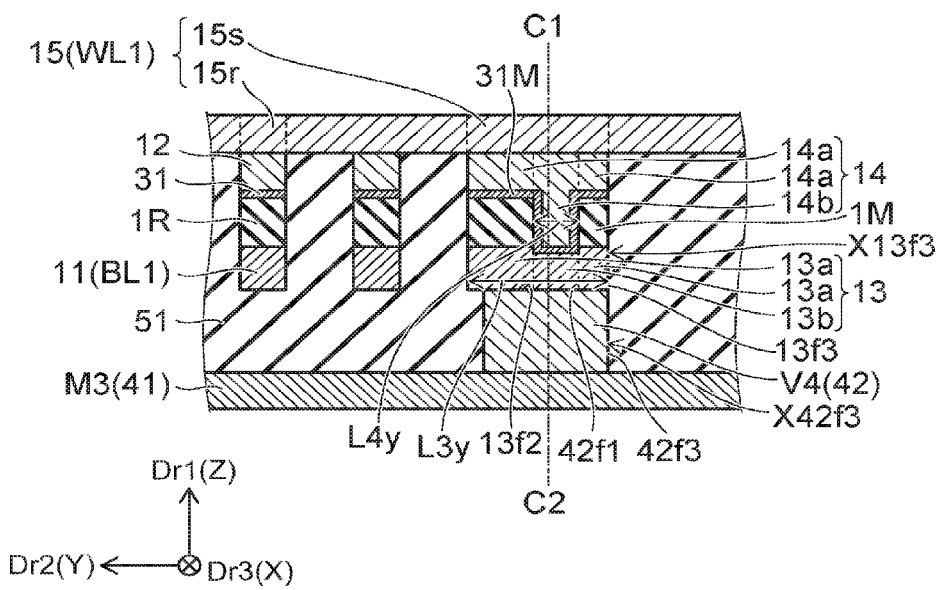
FIG. 2A and FIG. 2B are schematic sectional views each illustrating a portion of the semiconductor memory device according to the embodiment.
Figure 2B:
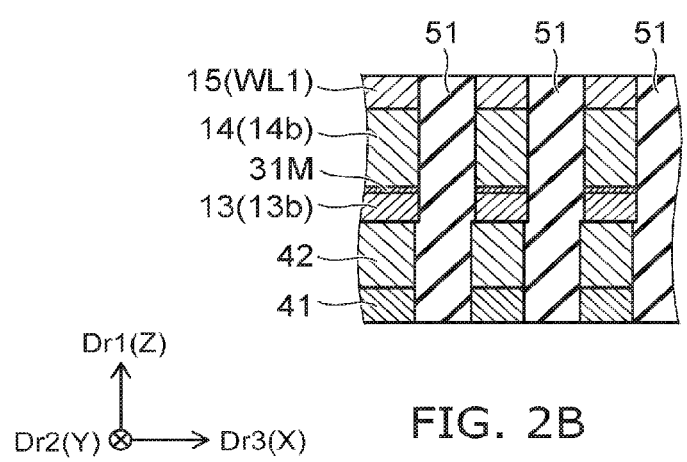

FIG. 2A and FIG. 2B are schematic sectional views each illustrating a portion of the semiconductor memory device according to the embodiment.

FIG. 2A is a schematic sectional view taken along the line B1-B2 in FIG. 1. FIG. 2B is a schematic sectional view taken along the line C1-C2 in FIG. 2A.

As shown in FIG. 1 and FIGS. 2A and 2B, the semiconductor memory device 100 according to the embodiment includes a first conductive layer 11, a second conductive layer 12, a first resistance change layer 1R, a third conductive layer 13, a fourth conductive layer 14, and a first intermediate layer 1M.

The second conductive layer 12 is provided separately from the first conductive layer 11 in a first direction Dr1. The first resistance change layer 1R is provided between the first conductive layer 11 and the second conductive layer 12.

The third conductive layer 13 is arranged with the first conductive layer 11 in a second direction Dr2 crossing the first direction Dr1. The third conductive layer 13 includes a portion 13a and another portion 13b. The third conductive layer 13 contains a material contained in the first conductive layer 11.

The first conductive layer 11 extends in, for example, a third direction Dr3 crossing the first direction Dr1 and crossing the second direction Dr2.

The fourth conductive layer 14 is arranged with the second conductive layer 12 in a direction Dr2a (not shown) crossing the first direction Dr1. The fourth conductive layer 14 is arranged with the third conductive layer 13 in the first direction Dr1. The fourth conductive layer 14 includes a portion 14a and another portion 14b. The fourth conductive layer 14 is electrically connected with the third conductive layer 13. The fourth conductive layer 14 contains a material contained in the second conductive layer 12.

The first intermediate layer 1M is provided between the portion 13a of the third conductive layer 13 and the portion 14a of the fourth conductive layer. The first intermediate layer 1M contains a material contained in the first resistance change layer 1R.

For example, the first direction Dr1 is a Z-direction. The second direction Dr2 is a Y-direction. The third direction Dr3 is an X-direction.

The semiconductor memory device 100 according to the embodiment further includes a fifth conductive layer 15 and a conductive portion 41. The fifth conductive layer 15 includes a first area 15r electrically connected with the second conductive layer 12 and a second area 15s electrically connected with the fourth conductive layer 14. The fifth conductive layer 15 extends in, for example, the second direction Dr2. The second conductive layer 12 is provided between the first area 15r and the first resistance change layer 1R. The fourth conductive layer 14 is provided between the second area 15s and the third conductive layer 13. The fifth conductive layer 15 and the conductive portion 41 are electrically connected.

The semiconductor memory device 100 according to the embodiment further includes the conductive portion 41 and a connecting portion 42. The first conductive layer 11, the first resistance change layer 1R, and the second conductive layer 12 are provided between a portion of the fifth conductive layer 15 and a portion of the conductive portion 41. The connecting portion 42 is provided between another portion of the conductive portion 41 and the third conductive layer 13. The one other portion of the conductive portion 41 and the third conductive layer 13 are electrically connected through the connecting portion 42.

An insulating layer 51 is provided around each of the fourth conductive layer 14, the first intermediate layer 1M, the third conductive layer 13, and the connecting portion 42. The insulating layer 51 is not arranged with the fourth conductive layer 14 in the first direction Dr1.

The one other portion 14b of the fourth conductive layer 14 is arranged with the first intermediate layer 1M in the second direction Dr2. A fourth length L4y of the one other portion 14b of the fourth conductive layer 14 along the second direction Dr2 is shorter than a third length L3y of the third conductive layer 13 along the second direction Dr2.

The semiconductor memory device 100 according to the embodiment further includes a first metal-containing layer 31 and a first metal intermediate layer 31M. The first metal-containing layer 31 is provided between the second conductive layer 12 and the first resistance change layer 1R. The first metal intermediate layer 31M is provided between the fourth conductive layer 14 and the first intermediate layer 1M and between the fourth conductive layer 14 and the third conductive layer 13. The first metal intermediate layer 31M contains a material contained in the first metal-containing layer 31.

The connecting portion 42 includes a first face 42f1 facing the third conductive layer 13. The connecting portion 42 includes a third face 42f3 crossing the first face 42f1. The third conductive layer 13 includes a second face 13f2 facing the first face 42f1. The third conductive layer 13 includes a third face 13f3 crossing the second face 13f2. A position X13f3 of the third face 13f3 in the third direction Dr3 is substantially the same as a position X42f3 of the third face 42f3 in the third direction Dr3.

The first conductive layer 11 is, for example, a first bit line BL1. The fifth conductive layer 15 is, for example, a first word line WL1. The first resistance change layer 1R is provided between the first conductive layer 11 (the first bit line BL1) and the fifth conductive layer 15 (the first word line WL1). The fifth conductive layer 15 is electrically connected with the conductive portion 41.

When, for example, a voltage VT is applied between the first conductive layer 11 and the fifth conductive layer 15, the resistance of the first resistance change layer 1R falls. Due to this, a current flows through the first resistance change layer 1R.

When, for example, a voltage VR lower than the voltage VT is applied between the first conductive layer 11 and the fifth conductive layer 15, the resistance of the first resistance change layer 1R rises. Due to this, a current is less likely to flow through the first resistance change layer 1R. The resistance of the first resistance change layer 1R changes in response to the applied voltage.

In a semiconductor memory device, an interval between two word lines WL is, for example, about 10 nm (nanometer), which may result in a narrow pitch interconnect. Similarly, an interval between two bit lines is about 10 nm (nanometer), which may result in a narrow pitch interconnect. For this reason, when, for example, a distance from the bit line BL to a lower layer interconnect M3 (the conductive portion 41) is long, alignment when providing a contact is difficult. Due to this, it becomes difficult to provide a contact from the bit line BL to the lower layer interconnect M3 (the conductive portion 41).

In the semiconductor memory device 100 according to the embodiment, the length of the first intermediate layer 1M along the first direction Dr1 is short, so that alignment when forming the one other portion 14b of the fourth conductive layer 14 is easy. Due to this, for example, the connecting portion 42 and the one other portion 14b of the fourth conductive layer 14 easily overlap each other in the first direction Dr1.

The fifth conductive layer 15 is, for example, the first word line WL1. The fifth conductive layer 15 (the first word line WL1) and the conductive portion 41 are electrically connected stably. A voltage can be stably applied from the conductive portion 41 through the connecting portion 42, the third conductive layer 13, and the fourth conductive layer 14 to the fifth conductive layer 15. As a result, it is possible to provide a semiconductor memory device capable of improving the stability of operation.

Figure 3A:
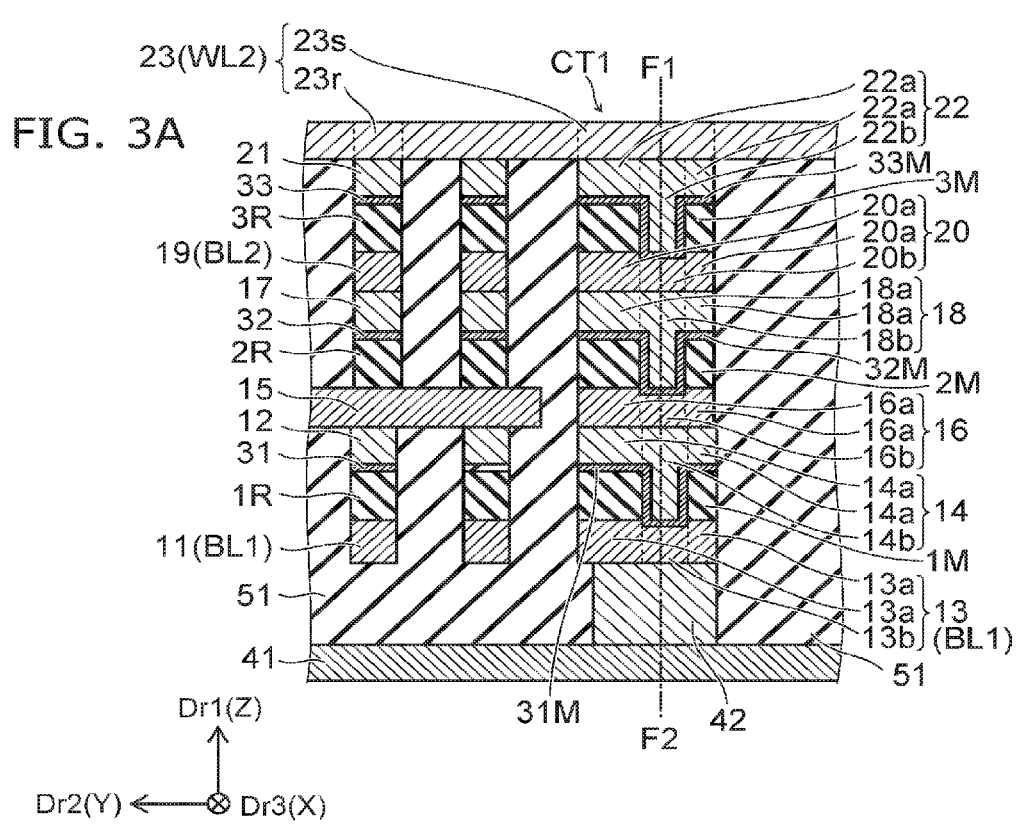
FIG. 3A and FIG. 3B are schematic sectional views each illustrating a portion of the semiconductor memory device according to the embodiment.
Figure 3B:
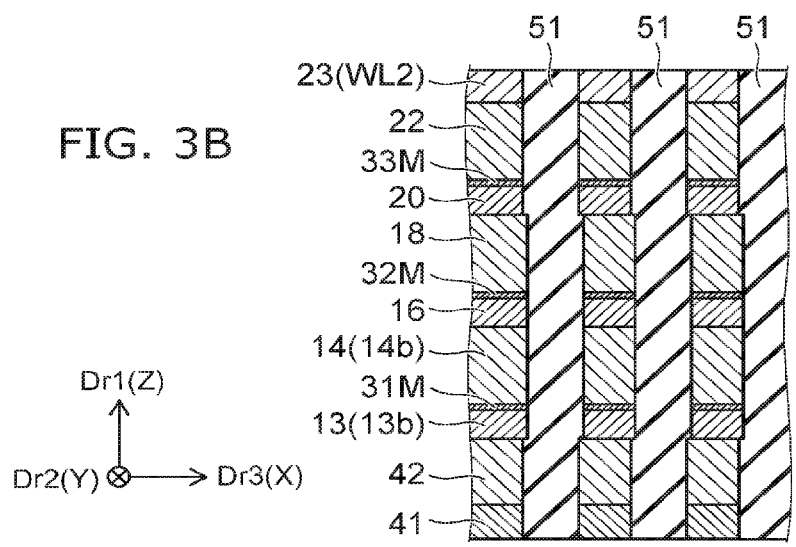

FIG. 3A and FIG. 3B are schematic sectional views each illustrating a portion of the semiconductor memory device according to the embodiment.

FIG. 3A is a schematic sectional view taken along the line D1-D2 in FIG. 1. FIG. 3B is a schematic sectional view taken along the line F1-F2 in FIG. 3A.

The semiconductor memory device 100 according to the embodiment includes first to tenth conductive layers (11 to 20), the first resistance change layer 1R, a second resistance change layer 2R, the first intermediate layer 1M, and a second intermediate layer 2M.

The second conductive layer 12 is disposed between the first conductive layer 11 and the ninth conductive layer 19. The fifth conductive layer 15 is disposed between the ninth conductive layer 19 and the second conductive layer 12. The seventh conductive layer 17 is disposed between the ninth conductive layer 19 and the fifth conductive layer 15. The seventh conductive layer 17 is electrically connected with the ninth conductive layer 19. The second resistance change layer 2R is disposed between the fifth conductive layer 15 and the seventh conductive layer 17. The fourth conductive layer 14 is disposed between the tenth conductive layer 20 and the third conductive layer 13.

The eighth conductive layer 18 is arranged with the seventh conductive layer 17 in a direction crossing the first direction Dr1. The sixth conductive layer 16 is disposed between the tenth conductive layer 20 and the fourth conductive layer 14. The eighth conductive layer 18 is disposed between the tenth conductive layer 20 and the sixth conductive layer 16. The second intermediate layer 2M is disposed between a portion 18a of the eighth conductive layer 18 and a portion 16a of the sixth conductive layer 16.

The sixth conductive layer 16 contains a material contained in the fifth conductive layer 15, and is electrically connected with the fourth conductive layer 14. The eighth conductive layer 18 contains a material contained in the seventh conductive layer 17, and is electrically connected with the sixth conductive layer 16. The tenth conductive layer 20 contains a material contained in the ninth conductive layer 19, and is electrically connected with the eighth conductive layer 18. The second intermediate layer 2M contains a material contained in the second resistance change layer 2R.

The semiconductor memory device 100 according to the embodiment further includes a second metal-containing layer 32 and a second metal intermediate layer 32M. The second metal-containing layer 32 is disposed between the seventh conductive layer 17 and the second resistance change layer 2R. The second metal intermediate layer 32M is disposed between the eighth conductive layer 18 and the second intermediate layer 2M and between the eighth conductive layer 18 and the sixth conductive layer 16. The second metal intermediate layer 32M contains a material contained in the second metal-containing layer 32. The ninth conductive layer 19 extends in the third direction Dr3.

The semiconductor memory device 100 according to the embodiment further includes eleventh to thirteenth conductive layers 21 to 23, a third resistance change layer 3R, and a third intermediate layer 3M. The ninth conductive layer 19 is disposed between one area (third area 23r) of the thirteenth conductive layer 23 and the seventh conductive layer 17. The eleventh conductive layer 21 is disposed between the third area 23r of the thirteenth conductive layer 23 and the ninth conductive layer 19. The third resistance change layer 3R is disposed between the eleventh conductive layer 21 and the ninth conductive layer 19.

The tenth conductive layer 20 is disposed between another area (fourth area 23s) of the thirteenth conductive layer 23 and the eighth conductive layer 18. The twelfth conductive layer 22 is disposed between the fourth area 23s of the thirteenth conductive layer 23 and the tenth conductive layer 20. The twelfth conductive layer 22 is arranged with the eleventh conductive layer 21 in a direction crossing the first direction Dr1. The third intermediate layer 3M is disposed between a portion 22a of the twelfth conductive layer 22 and a portion 20a of the tenth conductive layer. The twelfth conductive layer 22 contains a material contained in the eleventh conductive layer 21, and is electrically connected with the tenth conductive layer 20.

The third area 23r of the thirteenth conductive layer 23 is electrically connected with the eleventh conductive layer 21. The fourth area 23s of the thirteenth conductive layer 23 is electrically connected with the twelfth conductive layer 22. The third intermediate layer 3M contains a material contained in the third resistance change layer 3R.

The semiconductor memory device 100 according to the embodiment further includes a third metal-containing layer 33 and a third metal intermediate layer 33M. The third metal-containing layer 33 is provided between the eleventh conductive layer 21 and the third resistance change layer 3R. The third metal intermediate layer 33M is provided between the twelfth conductive layer 22 and the third intermediate layer 3M and between the twelfth conductive layer 22 and the tenth conductive layer 20. The third metal intermediate layer 33M contains a material contained in the third metal-containing layer 33. The thirteenth conductive layer 23 extends in the second direction Dr2.

Moreover, the semiconductor memory device 100 according to the embodiment includes a third counter conductive layer, a fourth counter conductive layer, and a first counter intermediate layer. The third counter conductive layer is separated from the first conductive layer 11 in the third direction Dr3, and contains a material contained in the first conductive layer 11. The fourth counter conductive layer is arranged with the second conductive layer 12 in a direction crossing the first direction Dr1 and crossing the second direction Dr2. The fourth counter conductive layer is electrically connected with the third counter conductive layer, and contains a material contained in the second conductive layer 12. The first counter intermediate layer is provided between a portion of the third counter conductive layer and a portion of the fourth counter conductive layer. The first counter intermediate layer contains a material contained in the first resistance change layer 1R. Another portion of the fourth counter conductive layer extends in the second direction Dr2.

At a contact (CT1) of a lead portion from the word line WL (WL2) as shown in FIG. 3A, all extending directions of cut portions (14b, 18b, and 22b) in the resistance change layers (1R, 2R, and 3R) are the third direction Dr3.

At a contact of a lead portion from the bit line BL (BL2), an extending direction of a cut portion (another portion of the fourth counter conductive layer) in the resistance change layer (the first resistance change layer 1R) is the second direction Dr2 in each layer.

In the semiconductor memory device 100 according to the embodiment, the length of the second intermediate layer 2M along the first direction Dr1 and the length of the third intermediate layer 3M along the first direction Dr1 are short similarly to the first intermediate layer 1M. Due to this, alignment when forming another portion 18b of the eighth conductive layer 18 and another portion 22b of the twelfth conductive layer 22 is easy.

The alignment is easy, and therefore, for example, the connecting portion 42 and the one other portion 18b of the eighth conductive layer 18 easily overlap each other in the first direction Dr1. The connecting portion 42 and the one other portion 22b of the twelfth conductive layer 22 easily overlap each other in the first direction Dr1.

The first contact CT1 includes, for example, the connecting portion 42, the third conductive layer 13, the fourth conductive layer 14, the sixth conductive layer 16, the eighth conductive layer 18, the tenth conductive layer 20, and the twelfth conductive layer 22. A voltage can be stably applied from the conductive portion 41 through the first contact CT1 to the thirteenth conductive layer 23. As a result, it is possible to provide a semiconductor memory device capable of improving the stability of operation.

FIG. 4A to FIG. 4H are schematic sectional views illustrating a method for manufacturing the semiconductor memory device according to the embodiment. FIG. 4B, FIG. 4D, FIG. 4F, and FIG. 4H correspond to a schematic sectional view taken along the line F1-F2 in FIG. 3A.

As shown in FIG. 4A and FIG. 4B, the conductive portion 41 is formed. A conductive material is deposited on the conductive portion 41 to form the connecting portion 42. That is, the lower layer interconnect M3 (the conductive portion 41) and a contact portion V4 (the connecting portion 42) to the lower layer interconnect M3 are deposited.

As shown in FIG. 4C and FIG. 4D, a portion of the connecting portion 42 is removed.

As shown in FIG. 4E and FIG. 4F, for example, silicon oxide is deposited, at the portion where the portion of the connecting portion 42 is removed, to form an insulating layer 51a. Chemical mechanical polishing (CMP) is performed on the insulating layer 51a and the connecting portion 42. Due to this, the insulating layer 51a and the connecting portion 42 are planarized.

As shown in FIG. 4G and FIG. 4H, portions of the conductive portion 41 are removed, so that the conductive portion 41 is divided in, for example, the third direction Dr3. Portions of the connecting portion 42 are removed, so that the connecting portion 42 is divided in, for example, the third direction Dr3. For example, silicon oxide is deposited at the portions where the conductive portion 41 is removed and at the portions where the connecting portion 42 is removed to form insulating layers 51b. CMP is performed on the connecting portion 42 and the insulating layers 51b to planarize the connecting portion 42 and the insulating layers 51b. That is, patterns of the lower layer interconnect M3 (the conductive portion 41) are formed. The portions where the conductive portion 41 is removed and the portions where the connecting portion 42 is removed due to the formation of the patterns are filled with, for example, silicon oxide, and planarization is performed by CMP.

FIG. 5A, FIG. 5B, FIG. 6A, FIG. 6B, FIG. 7A, FIG. 7B, FIG. 8A to FIG. 8D, FIG. 9A, FIG. 9B, FIG. 10A, FIG. 10B, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, FIG. 20B, FIG. 21A, FIG. 21B, FIG. 22A and FIG. 22B are schematic sectional views illustrating the method for manufacturing the semiconductor memory device according to the embodiment.

FIG. 5A, FIG. 6A, FIG. 7A, FIG. 8A, FIG. 8C, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A and FIG. 22A correspond to a schematic sectional view taken along the line D1-D2.

FIG. 5B, FIG. 6B, FIG. 7B, FIG. 8B, FIG. 8D, FIG. 9B, FIG. 10B, FIG. 11B, FIG. 12B, FIG. 13B, FIG. 14B, FIG. 15B, FIG. 16B, FIG. 17B, FIG. 18B, FIG. 19B, FIG. 20B, FIG. 21B and FIG. 22B correspond to a schematic sectional view taken along the line F1-F2.

FIG. 5C, FIG. 7C, FIG. 9C, FIG. 10C, FIG. 14C, FIG. 15C and FIG. 19C are schematic plan views illustrating the method for manufacturing the semiconductor memory device according to the embodiment.

As shown in FIG. 5A to FIG. 5C, for example, tungsten is deposited on the connecting portion 42, the insulating layer 51a, and the insulating layers 51b to form the first conductive layer 11. The first resistance change layer 1R is formed on the first conductive layer 11. A portion of the first resistance change layer 1R and a portion of the first conductive layer 11 are removed. Due to this, a first groove ER1 (groove 61) extending in, for example, the third direction Dr3 is formed. A portion of the first groove ER1 (the groove 61) is arranged with the connecting portion 42 in the first direction Dr1. A groove 61y (not shown) extending in the second direction Dr2 may be formed.

Figures 6A, 6B:
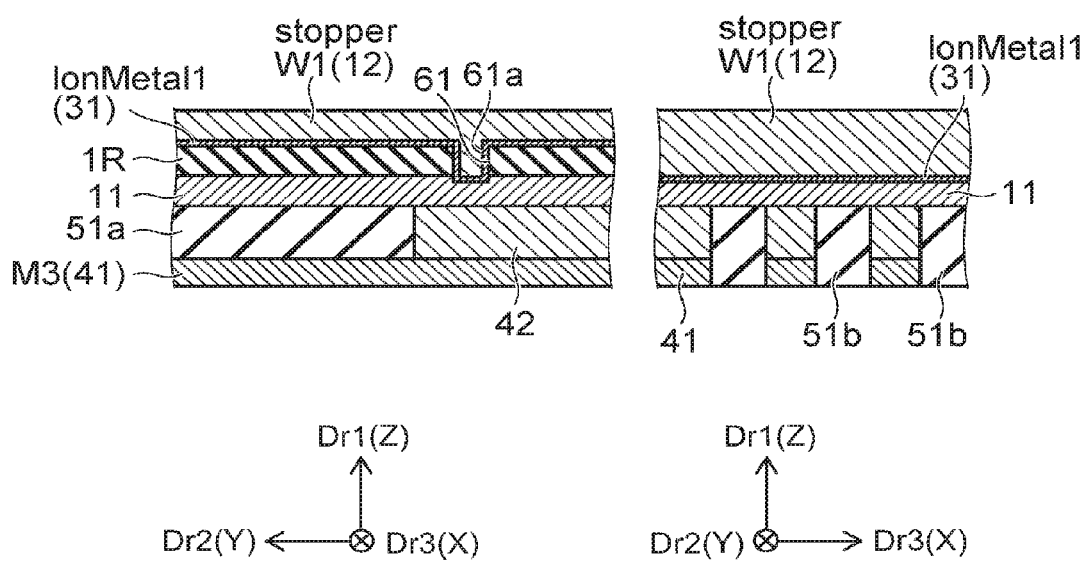

As shown in FIG. 6A and FIG. 6B, an Ion Metal 1 (the first metal-containing layer 31) is formed on the first conductive layer 11 and the first resistance change layer 1R. Due to this, a groove 61a that reflects the groove 61 is formed. For example, tungsten is deposited on the first metal-containing layer 31 and fills the groove 61a to form a stopper W1 (the second conductive layer 12). At this time, the groove 61 is filled with the Ion Metal 1 and the stopper W1.

As shown in FIG. 7A to FIG. 7C, portions of the second conductive layer 12, portions of the first metal-containing layer 31, portions of the first resistance change layer 1R, portions of the first conductive layer 11, and portions of the insulating layer 51a are removed. Due to this, a plurality of grooves 71 extending in the third direction Dr3 is formed. The second conductive layer 12 is divided in the second direction Dr2, and the fourth conductive layer 14 is formed. The first metal-containing layer 31 is divided in the second direction Dr2, and the first metal intermediate layer 31M is formed. The first resistance change layer 1R is divided in the second direction Dr2, and the first intermediate layer 1M is formed. The first conductive layer 11 is divided in the second direction Dr2, and the third conductive layer 13 is formed. At this time, the first groove ER1 (the groove 61) is set to be located inside the contact portion V4 (the connecting portion 42).

The insulating layer 51a is provided between the first bit line BL1 (the first conductive layer 11) and the lower layer interconnect M3 (the conductive portion 41). Due to this, the first bit line BL1 (the first conductive layer 11) and the lower layer interconnect M3 (the conductive portion 41) are not electrically connected.

As shown in FIG. 8A and FIG. 8B, the grooves 71 are filled with, for example, an insulating material to form insulating layers 51c. The insulating layer 51 includes the insulating layer 51a, the insulating layers 51b, and the insulating layers 51c. Planarization is performed by CMP using the stopper W1 (the second conductive layer 12) as a stopper.

As shown in FIG. 8C and FIG. 8D, for example, tungsten is deposited on the second conductive layer 12, the fourth conductive layer 14, and the insulating layer 51 to form the first word line WL1 (the fifth conductive layer 15). The second resistance change layer 2R is formed on the fifth conductive layer 15. A portion of the second resistance change layer 2R is removed. Due to this, a groove ER2 (groove 62) extending in the third direction Dr3 is formed. An Ion Metal 2 (the second metal-containing layer 32) is formed on the fifth conductive layer 15 and the second resistance change layer 2R. For example, tungsten is deposited on the second metal-containing layer 32 and fills the groove 62 to form a stopper W2 (the seventh conductive layer 17).

Figures 9A, 9B:
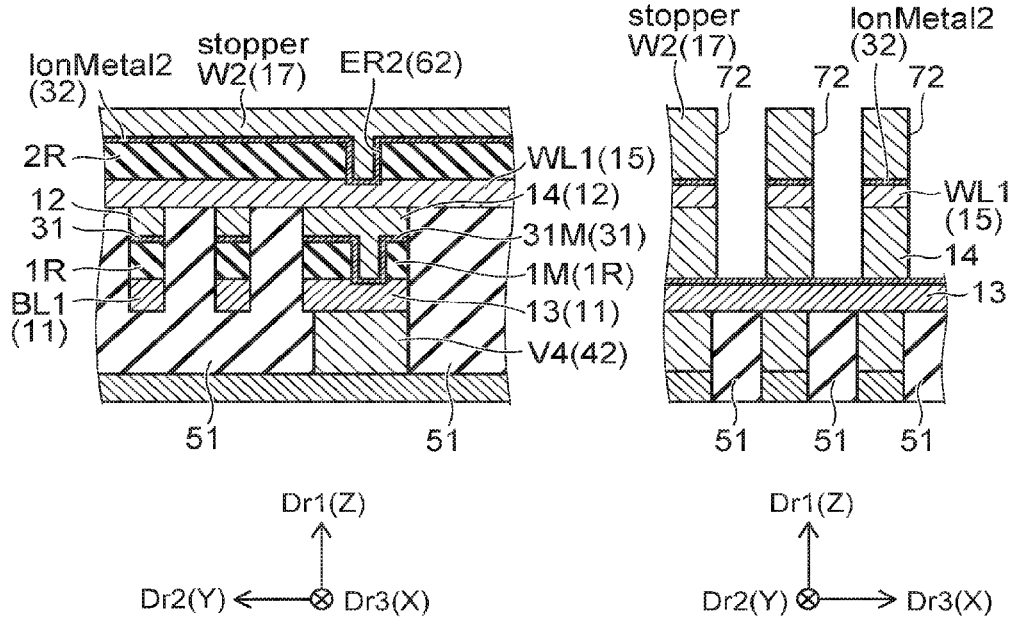
Figure 9C:
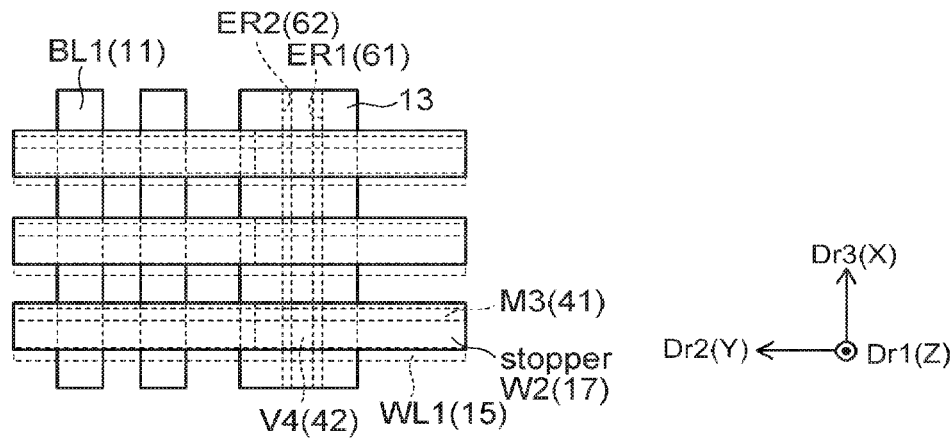

As shown in FIG. 9A to FIG. 9C, portions of the seventh conductive layer 17, portions of the second metal-containing layer 32, portions of the second resistance change layer 2R, portions of the fifth conductive layer 15, portions of the second conductive layer 12, portions of the fourth conductive layer 14, portions of the first intermediate layer 1M, and portions of the first resistance change layer 1R are removed. Due to this, a plurality of grooves 72 is formed. The seventh conductive layer 17 is divided in the third direction. The second metal-containing layer 32 is divided in the third direction. The second resistance change layer 2R is divided in the third direction. The fifth conductive layer 15 is divided in the third direction. The second conductive layer 12 is divided in the third direction. The fourth conductive layer 14 is divided in the third direction. The first intermediate layer 1M is divided in the third direction. The first resistance change layer 1R is divided in the third direction. The first bit line BL1 (the first conductive layer 11) is not divided in the third direction. The third conductive layer 13 is not divided in the third direction.

As shown in FIG. 10A to FIG. 10C, a resist film 81 is formed on a portion of the seventh conductive layer 17. At this time, the contact portion V4 (the connecting portion 42) and the resist film 81 are set so as not to overlap each other in the first direction Dr1. For example, a photo engraving process (PEP) is performed on the resist film 81 and the seventh conductive layer 17.

Figure 11A:
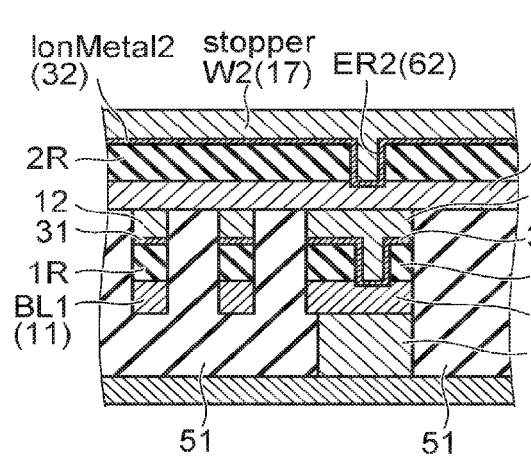
Figure 11B:
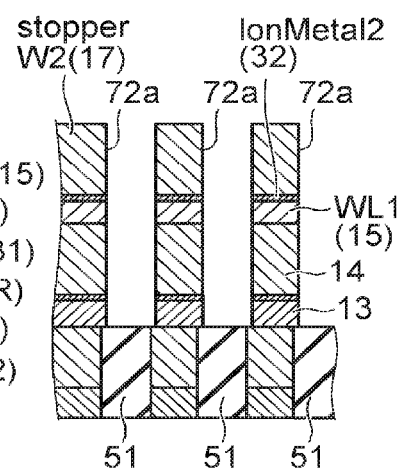

As shown in FIG. 11A and FIG. 11B, for example, reactive ion etching (RIE) is performed to remove portions of the third conductive layer. The first conductive layer 11 is not removed due to the resist film 81. Due to this, grooves 72a that reflect the grooves 72 are formed. The third conductive layer 13 is divided in the third direction.

Figure 12A:
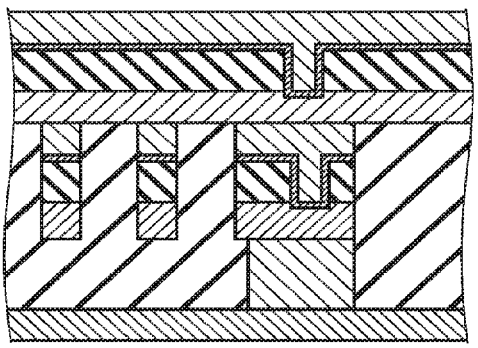
Figure 12A:
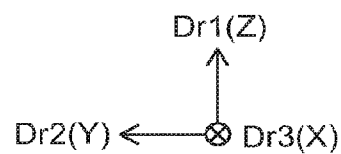
Figure 12B:
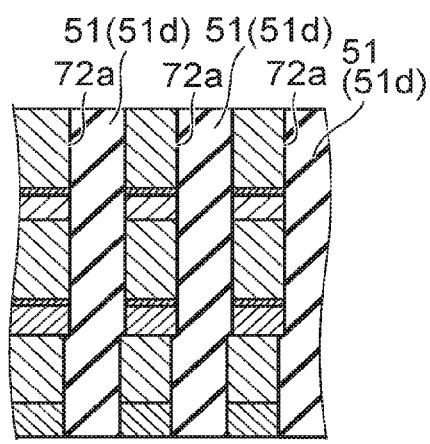
Figure 12B:
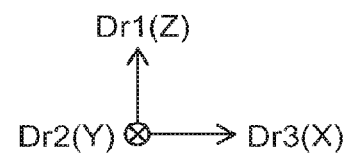

As shown in FIG. 12A and FIG. 12B, the grooves 72a are filled with, for example, an insulating material to form insulating layers 51d. The insulating layer 51 further includes the insulating layers 51d.

As shown in FIG. 13A and FIG. 13B, for example, tungsten is deposited on the seventh conductive layer 17 and the insulating layer 51 to form the second bit line BL2 (the ninth conductive layer 19). The third resistance change layer 3R is formed on the ninth conductive layer 19. A portion of the third resistance change layer 3R is removed. Due to this, a groove ER3 (groove 63) extending in the third direction Dr3 is formed. An Ion Metal 3 (the third metal-containing layer 33) is formed on the ninth conductive layer 19 and on the third resistance change layer 3R. For example, tungsten is deposited on the third metal-containing layer 33 and fills the groove 63 to form a stopper W3 (the eleventh conductive layer 21).

Figure 14A:
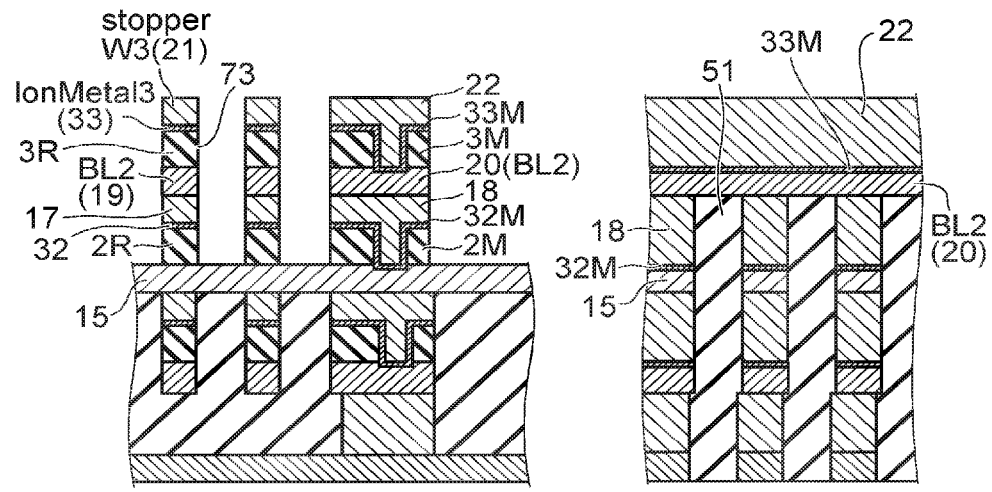
Figure 14A:
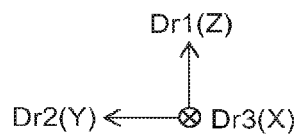
Figure 14B:
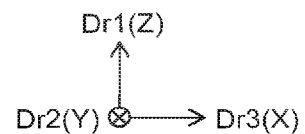
Figure 14C:
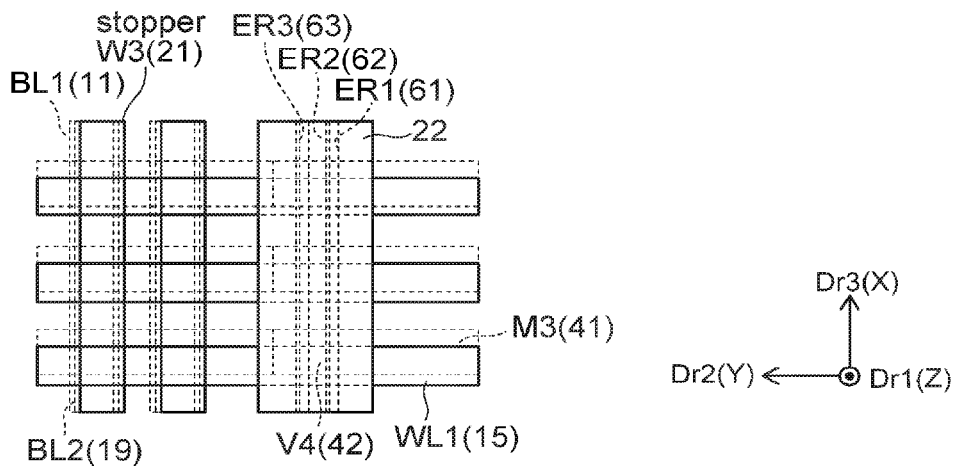

As shown in FIG. 14A to FIG. 14C, a plurality of grooves 73 is formed through from the twelfth conductive layer 22 to the second resistance change layer 2R in the first direction Dr1. Due to this, the second resistance change layer 2R is divided in the second direction Dr2, and the second intermediate layer 2M is formed. The second metal-containing layer 32 is divided in the second direction Dr2, and the second metal intermediate layer 32M is formed. The seventh conductive layer 17 is divided in the second direction Dr2, and the eighth conductive layer 18 is formed. The ninth conductive layer 19 is divided in the second direction Dr2, and the tenth conductive layer 20 is formed. The third resistance change layer 3R is divided in the second direction Dr2, and the third intermediate layer 3M is formed. The third metal-containing layer 33 is divided in the second direction Dr2, and the third metal intermediate layer 33M is formed. The eleventh conductive layer 21 is divided in the second direction Dr2, and the twelfth conductive layer 22 is formed.

As shown in FIG. 15A to FIG. 15C, a resist film 82 is formed. At this time, the contact portion V4 (the connecting portion 42) and the resist film 82 are set so as not to overlap each other in the first direction Dr1. For example, a photo engraving process (PEP) is performed on the resist film 82, the twelfth conductive layer 22, etc.

Figure 16A:
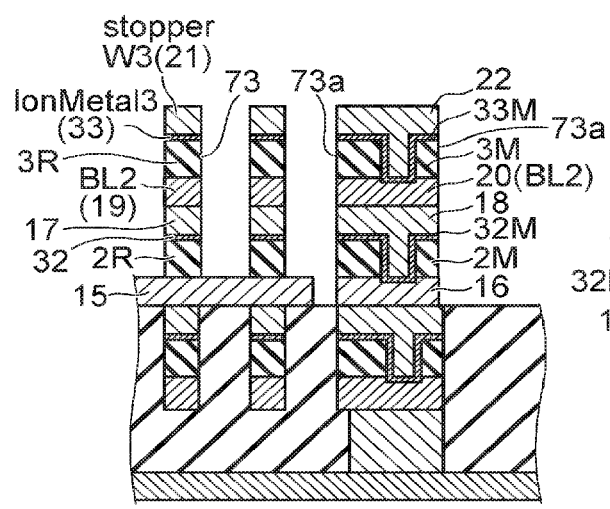
Figure 16A:
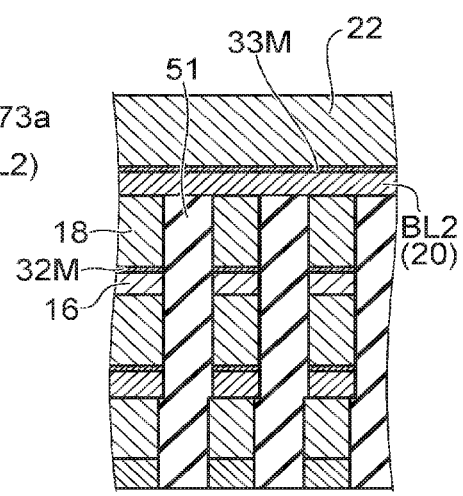
Figure 16A:
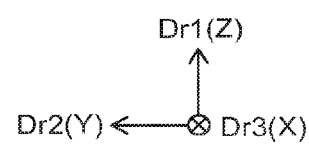
Figure 16B:
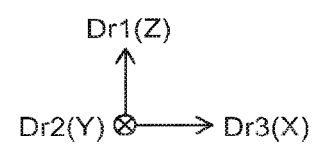

As shown in FIG. 16A and FIG. 16B, for example, RIE is performed to remove portions of the fifth conductive layer 15. Due to this, grooves 73a that reflect the grooves 73 are formed. The fifth conductive layer 15 is divided in the second direction Dr2, and the sixth conductive layer 16 is formed.

Figures 17A, 17B:
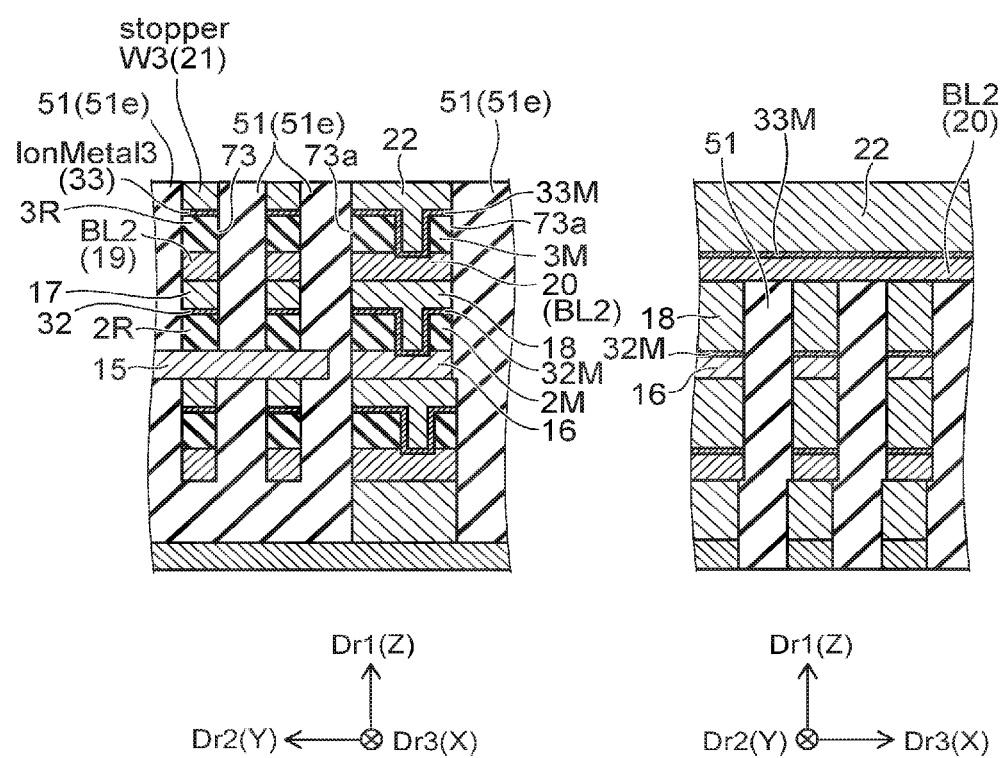

As shown in FIG. 17A and FIG. 17B, the grooves 73 and the grooves 73a are filled with, for example, an insulating material to form insulating layers 51e. The insulating layer 51 further includes the insulating layers 51e.

Figures 18A, 18B:
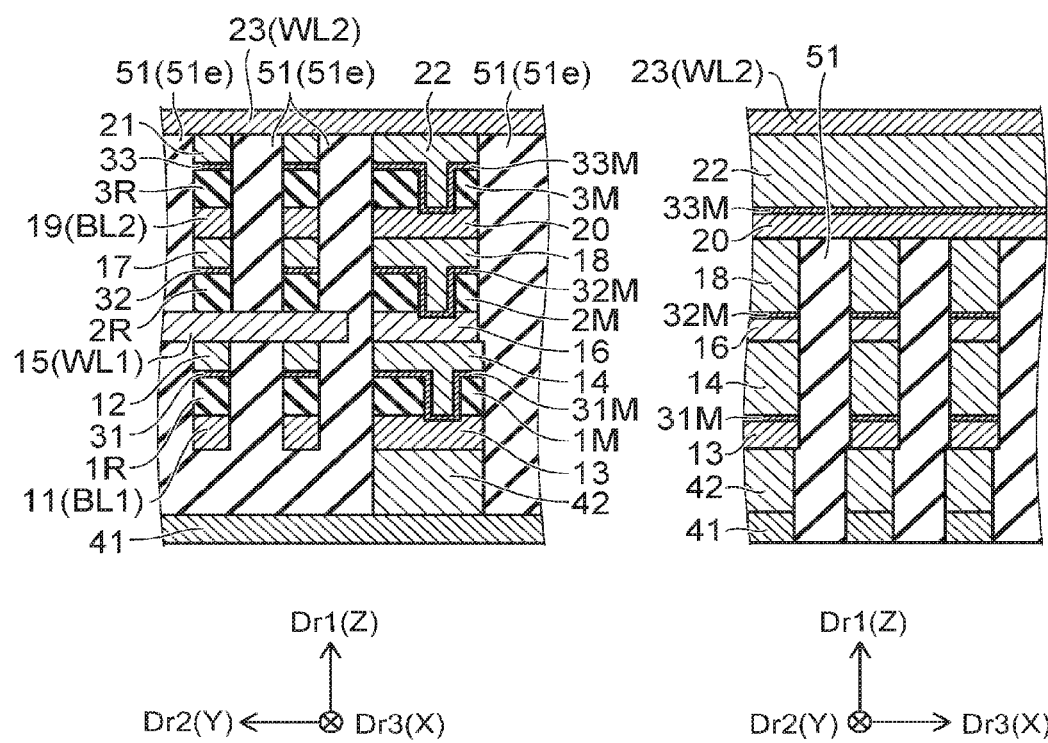

As shown in FIG. 18A and FIG. 18B, for example, tungsten is deposited on the eleventh conductive layer 21, the twelfth conductive layer 22, and the insulating layer 51 to form the second word line WL2 (the thirteenth conductive layer 23).

Figure 19A:
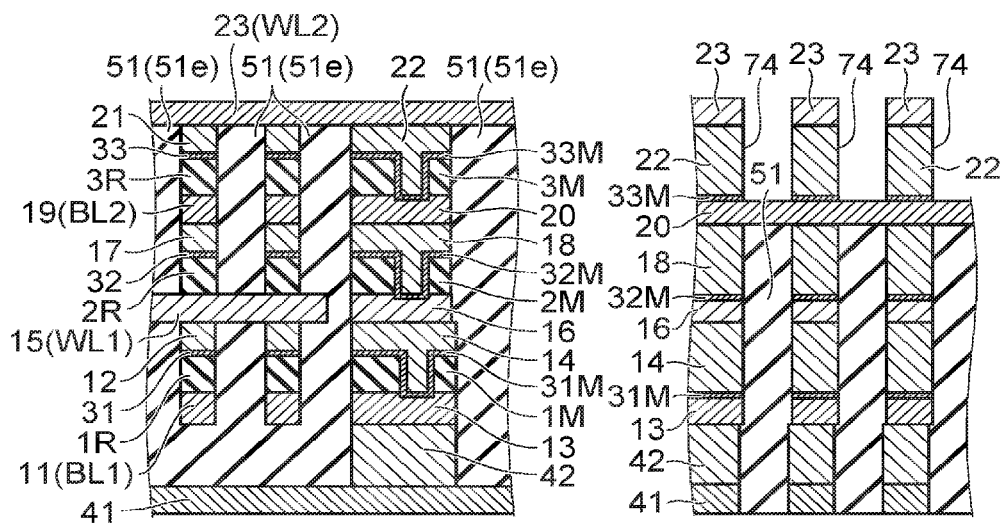
Figure 19A:
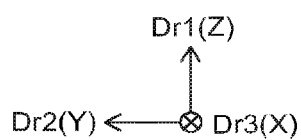
Figure 19B:
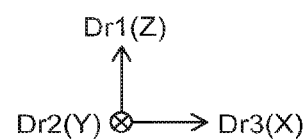
Figure 19C:
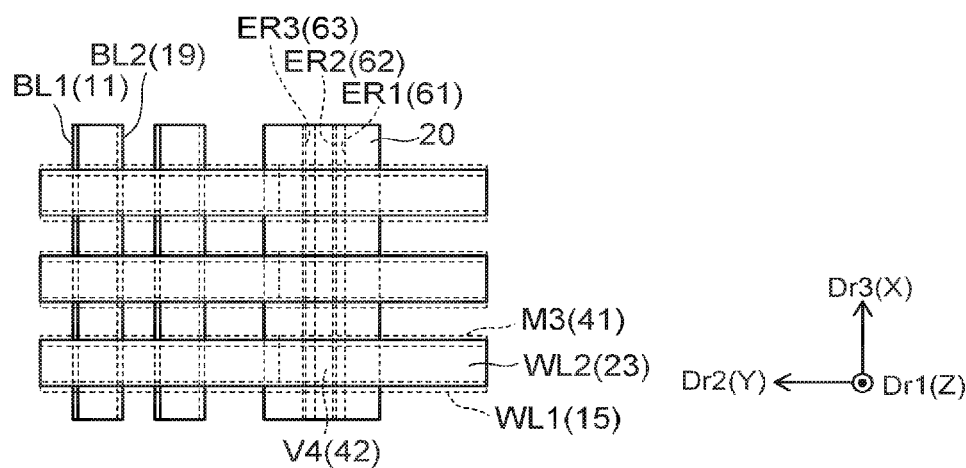

As shown in FIG. 19A to FIG. 19C, portions of the thirteenth conductive layer 23, portions of the third resistance change layer 3R, portions of the third metal-containing layer 33, portions of the twelfth conductive layer 22, portions of the third metal intermediate layer 33M, and portions of the third intermediate layer 3M are removed to form a plurality of grooves 74 extending in the second direction. The twelfth conductive layer 22 is divided in the third direction Dr3. The thirteenth conductive layer 23 is divided in the third direction Dr3.

Figure 20A:
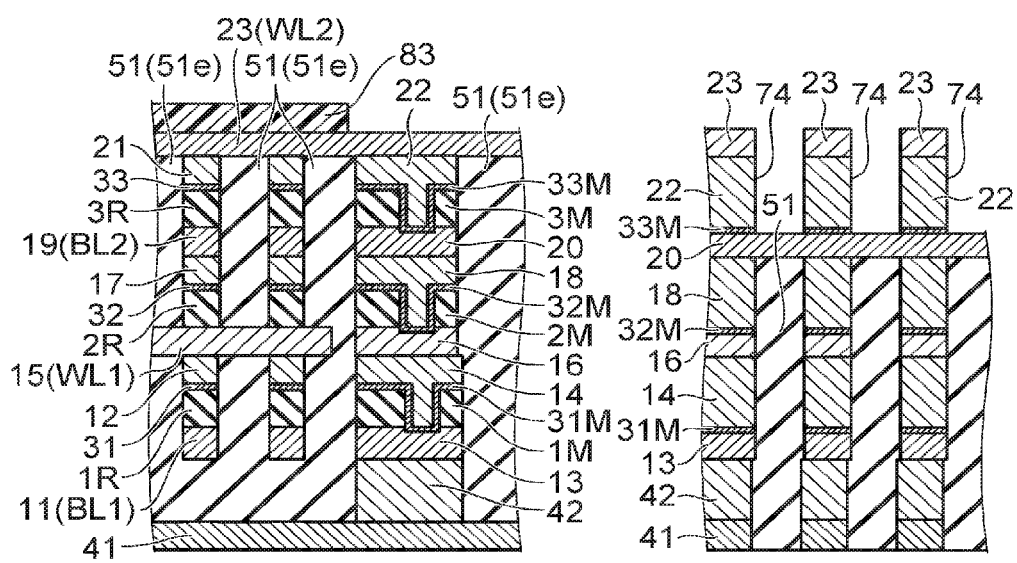
Figure 20A:
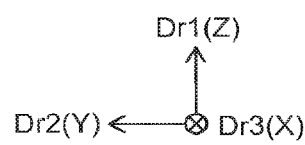
Figure 20B:
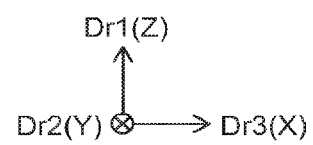

As shown in FIG. 20A and FIG. 20B, a resist film 83 is formed on a portion of the thirteenth conductive layer 23. At this time, the contact portion V4 (the connecting portion 42) and the resist film 83 are set so as not to overlap each other in the first direction Dr1. For example, a photo engraving process (PEP) is performed on the resist film 83 and the thirteenth conductive layer 23.

Figures 21A, 21B:
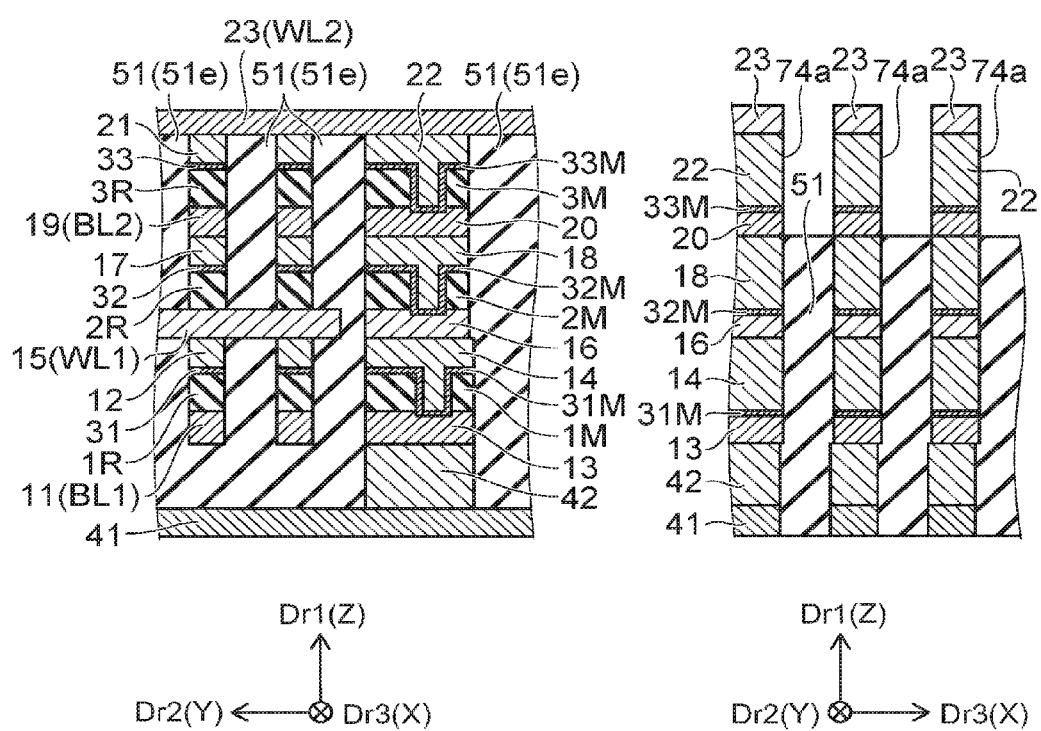

As shown in FIG. 21A and FIG. 21B, for example, RIE is performed to remove portions of the tenth conductive layer 20. Due to this, grooves 74a that reflect the grooves 74 are formed. The tenth conductive layer 20 is divided in the third direction Dr3.

Figures 22A, 22B:
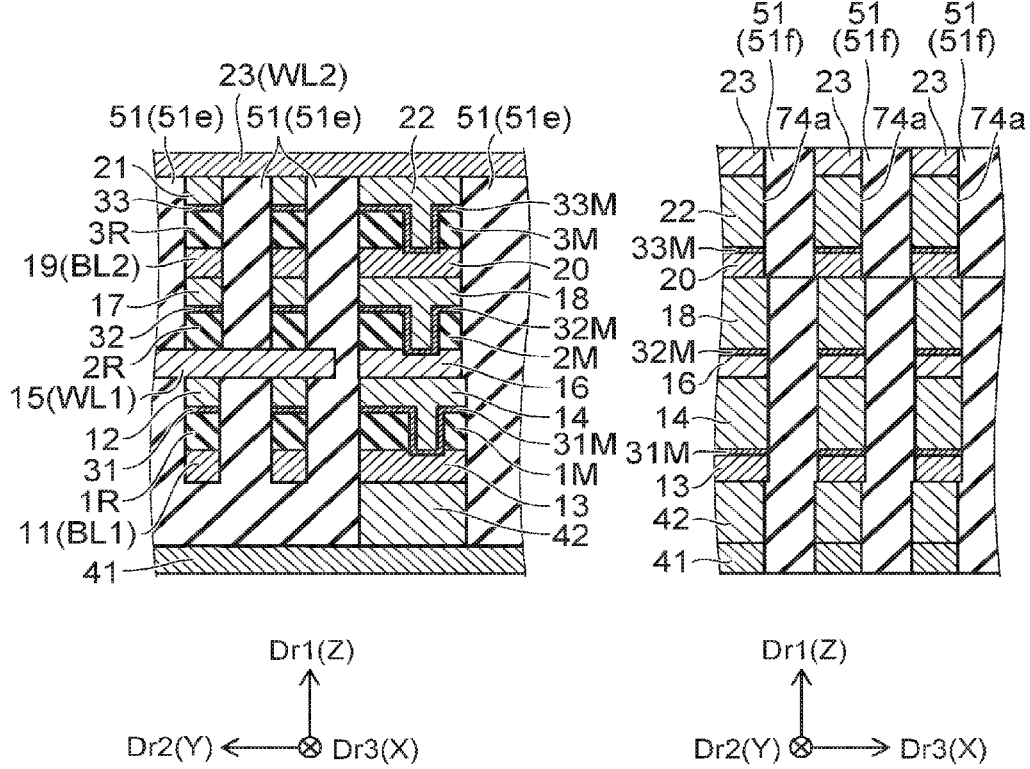

As shown in FIG. 22A and FIG. 22B, the grooves 74a are filled with, for example, an insulating material to form insulating layers 51f. The thirteenth conductive layer 23 and the insulating layers 51f are planarized by CMP. The insulating layer 51 further includes the insulating layers 51f.

This example assumes an ion memory, in which a resistance change layer and an Ion Metal are provided from the bottom. The embodiment can be applied to all structures including a cross-point cell array such as a ReRAM.

According to the embodiment, it is possible to provide a semiconductor memory device capable of improving the stability of operation and a method for manufacturing the semiconductor memory device.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a first conductive layer;
a second conductive layer separated from the first conductive layer in a first direction;
a first resistance change layer provided between the first conductive layer and the second conductive layer;
a third conductive layer arranged with the first conductive layer in a second direction crossing the first direction, the third conductive layer containing a material contained in the first conductive layer;
a fourth conductive layer arranged with the second conductive layer in a direction crossing the first direction, the fourth conductive layer being arranged with the third conductive layer in the first direction, electrically connected with the third conductive layer, and containing a material contained in the second conductive layer; and
a first intermediate layer provided between a portion of the third conductive layer and a portion of the fourth conductive layer and containing a material contained in the first resistance change layer.

2. The device according to claim 1, further comprising a fifth conductive layer including a first area electrically connected with the second conductive layer and a second area electrically connected with the fourth conductive layer,
the second conductive layer being provided between the first area and the first resistance change layer, and
the fourth conductive layer being provided between the second area and the third conductive layer.

3. The device according to claim 2, further comprising:
a conductive portion; and
a connecting portion,
the first conductive layer, the first resistance change layer, and the second conductive layer being provided between a portion of the fifth conductive layer and a portion of the conductive portion,
the connecting portion being provided between one other portion of the conductive portion and the third conductive layer, and
the one other portion of the conductive portion and the third conductive layer being electrically connected through the connecting portion.

4. The device according to claim 1, wherein
the fourth conductive layer further includes one other portion of the fourth conductive layer, the one other portion of the fourth conductive layer being arranged with the first intermediate layer in the second direction, and
a fourth length of the one other portion of the fourth conductive layer along the second direction is shorter than a third length of the third conductive layer along the second direction.

5. The device according to claim 1, further comprising:
a first metal-containing layer provided between the second conductive layer and the first resistance change layer; and
a first metal intermediate layer provided between the fourth conductive layer and the first intermediate layer and between the fourth conductive layer and the third conductive layer, and containing a material contained in the first metal-containing layer.

6. The device according to claim 2, wherein
the first conductive layer extends in a third direction crossing the first direction and crossing the second direction, and
the fifth conductive layer extends in the second direction.

7. The device according to claim 1, further comprising:
fifth to tenth conductive layers;
a second resistance change layer; and
a second intermediate layer,
the second conductive layer being disposed between the first conductive layer and the ninth conductive layer,
the fifth conductive layer being disposed between the ninth conductive layer and the second conductive layer,
the seventh conductive layer electrically connected with the ninth conductive layer being disposed between the ninth conductive layer and the fifth conductive layer,
the second resistance change layer being disposed between the fifth conductive layer and the seventh conductive layer,
the fourth conductive layer being disposed between the tenth conductive layer and the third conductive layer,
the eighth conductive layer being arranged with the seventh conductive layer in a direction crossing the first direction,
the sixth conductive layer being disposed between the tenth conductive layer and the fourth conductive layer,
the eighth conductive layer being disposed between the tenth conductive layer and the sixth conductive layer,
the second intermediate layer being disposed between a portion of the eighth conductive layer and a portion of the sixth conductive layer,
the sixth conductive layer containing a material contained in the fifth conductive layer and being electrically connected with the fourth conductive layer,
the eighth conductive layer containing a material contained in the seventh conductive layer and being electrically connected with the sixth conductive layer,
the tenth conductive layer containing a material contained in the ninth conductive layer and being electrically connected with the eighth conductive layer, and
the second intermediate layer containing a material contained in the second resistance change layer.

8. The device according to claim 7, wherein
the first conductive layer extends in a third direction crossing the first direction and crossing the second direction,
the fifth conductive layer extends in the second direction, and
the ninth conductive layer extends in the third direction.

9. The device according to claim 7, further comprising:
eleventh to thirteenth conductive layers;
a third resistance change layer; and
a third intermediate layer,
the ninth conductive layer being disposed between a third area of the thirteenth conductive layer and the seventh conductive layer, the eleventh conductive layer being disposed between the third area of the thirteenth conductive layer and the ninth conductive layer, the third resistance change layer being disposed between the eleventh conductive layer and the ninth conductive layer, the tenth conductive layer being disposed between a fourth area of the thirteenth conductive layer and the eighth conductive layer, the twelfth conductive layer being disposed between the fourth area of the thirteenth conductive layer and the tenth conductive layer, the twelfth conductive layer being arranged with the eleventh conductive layer in a direction crossing the first direction, the third intermediate layer being disposed between a portion of the twelfth conductive layer and a portion of the tenth conductive layer, the twelfth conductive layer containing a material contained in the eleventh conductive layer and being electrically connected with the tenth conductive layer, the third area of the thirteenth conductive layer being electrically connected with the eleventh conductive layer, the fourth area of the thirteenth conductive layer being electrically connected with the twelfth conductive layer, and the third intermediate layer containing a material contained in the third resistance change layer.

10. The device according to claim 9, wherein the thirteenth conductive layer extends in the second direction.

11. The device according to claim 7, comprising:

a third counter conductive layer separated from the first conductive layer in the third direction and containing a material contained in the first conductive layer;

a fourth counter conductive layer arranged with the second conductive layer in a direction crossing the first direction and crossing the second direction, the fourth counter conductive layer being electrically connected with the third counter conductive layer and containing a material contained in the second conductive layer; and a first counter intermediate layer provided between a portion of the third counter conductive layer and a portion of the fourth counter conductive layer and containing a material contained in the first resistance change layer, one other portion of the fourth counter conductive layer extending in the second direction.

* * * * *